US012587029B2

(12) United States Patent
Kawasaki et al.

(10) Patent No.: US 12,587,029 B2
(45) Date of Patent: Mar. 24, 2026

(54) POWER SUPPLY APPARATUS

(71) Applicant: DENSO CORPORATION, Kariya-city (JP)

(72) Inventors: Hirokazu Kawasaki, Kariya-city (JP); Hideki Kabune, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 168 days.

(21) Appl. No.: 18/531,512

(22) Filed: Dec. 6, 2023

(65) Prior Publication Data

US 2024/0106264 A1     Mar. 28, 2024

Related U.S. Application Data

(63) Continuation of application No. PCT/JP2022/020621, filed on May 18, 2022.

(30) Foreign Application Priority Data

Jun. 8, 2021     (JP) ................................. 2021-095704

(51) Int. Cl.
| | |
|---|---|
| *H02J 9/06* | (2006.01) |
| *B62D 5/04* | (2006.01) |
| *G01R 31/00* | (2006.01) |
| *G01R 31/52* | (2020.01) |
| *H02H 9/02* | (2006.01) |

(52) U.S. Cl.
CPC .............. *H02J 9/062* (2013.01); *B62D 5/046* (2013.01); *B62D 5/0484* (2013.01); *G01R 31/006* (2013.01); *G01R 31/52* (2020.01);

*H02H 9/02* (2013.01); *H02J 9/068* (2020.01); *H02J 2310/40* (2020.01)

(58) Field of Classification Search
CPC ........ H02J 9/062; H02J 9/068; H02J 2310/40; B62D 5/046; B62D 5/0484; G01R 31/006; G01R 31/52; G01R 31/42; H02H 9/02; H02H 5/105; H02M 7/48; H02P 29/024
See application file for complete search history.

(56) References Cited

U.S. PATENT DOCUMENTS

| | | | | |
|---|---|---|---|---|
| 9,647,603 | B2 * | 5/2017 | Koseki | ................ H02P 29/0241 |
| 10,348,237 | B2 * | 7/2019 | Sakashita | ............. B62D 5/0403 |

(Continued)

FOREIGN PATENT DOCUMENTS

| | | |
|---|---|---|
| DE | 102016102248 A1 | 8/2017 |

*Primary Examiner* — Thienvu V Tran
*Assistant Examiner* — Muaamar Qahtan Al-Taweel
(74) *Attorney, Agent, or Firm* — Precision Patents, P.C.

(57) ABSTRACT

A plurality of systems of power supply circuits are provided between a power source and a load and are capable of cooperatively supplying power to the load using power of the power sources. In the power supply circuits, ground lines connected to a negative pole of the power source are configured independently for each system. A plurality of ground current detectors detect ground currents that are currents flowing through the ground lines of each system. The control units have ground line diagnosis portions that diagnose an abnormality in the ground lines based on the ground currents. When the ground line diagnosis portions determine that at least one system ground line is abnormal, the control units change the operation of the power supply circuit of the system determined to be abnormal.

13 Claims, 6 Drawing Sheets

(56)          References Cited

U.S. PATENT DOCUMENTS

| | | | | |
|---|---|---|---|---|
| 10,994,769 | B2 * | 5/2021 | Koseki | B62D 5/0403 |
| 11,084,438 | B2 * | 8/2021 | Kawakami | H02J 1/102 |
| 11,323,058 | B2 * | 5/2022 | Koseki | H02P 25/16 |
| 2017/0272009 | A1 * | 9/2017 | Kawamura | B60L 3/0046 |
| 2020/0406963 | A1 | 12/2020 | Nakada et al. | |

* cited by examiner

FIG. 2

FIRST AND SECOND EMBODIMENTS

FIG. 3

THIRD AND FOURTH EMBODIMENTS

FIRST AND THIRD EMBODIMENTS    COMMON CONNECTOR

SECOND AND FOURTH EMBODIMENTS    SYSTEM-SPECIFIC CONNECTOR

ABNORMALITY DIAGNOSIS MAP OF FIRST SYSTEM

GROUND POWER RATIO
$\rho 1 = Pg1/Pg2$

NORMAL

GROUND POWER OF FIRST SYSTEM Pg1

POWER [W]

ABNORMALITY DIAGNOSIS MAP OF SECOND SYSTEM

GROUND POWER RATIO
$\rho 2 = Pg2/Pg1$

NORMAL

GROUND POWER OF SECOND SYSTEM Pg2

POWER [W]

POWER SUPPLY APPARATUS

CROSS-REFERENCE TO RELATED APPLICATIONS

This application is a continuation application of International Patent Application No. PCT/JP2022/020621 filed on May 18, 2022, which designated the U.S. and based on and claims the benefits of priority of Japanese Patent Application No. 2021-095704 filed on Jun. 8, 2021. The entire disclosure of all of the above applications is incorporated herein by reference.

TECHNICAL FIELD

The present disclosure relates to a power supply apparatus.

BACKGROUND

Conventionally, there has been known an apparatus for detecting poor connection of a ground line in a power supply circuit.

SUMMARY

An object of the present disclosure is to provide a power supply apparatus capable of executing an abnormality processing when an abnormality occurs in the ground line of at least one system.

A power supply apparatus of the present disclosure includes a plurality of systems of power supply circuits and a plurality of ground current detectors. A plurality of power supply circuits are provided between one or more power sources and a load, and is capable of working together to supply power to the loads using the power of the power sources. A ground line connected to a negative electrode of the power source from the power supply circuits of the plurality of systems is configured independently for each system.

A plurality of ground current detectors detect a ground current, which is a current flowing through the ground line of each system. The control unit controls the operation of the power supply circuit of each system.

The control unit has a ground line diagnosis portion that diagnoses an abnormality in the ground line based on the ground current. When the ground line diagnosis portion determines that at least one system ground line is abnormal, the control unit changes an operation of the power supply circuit of the system determined to be abnormal.

BRIEF DESCRIPTION OF THE DRAWINGS

The above and other objects, features and advantages of the present disclosure will become more apparent from the following detailed description made with reference to the accompanying drawings. In the drawings:

FIG. 2 is a configuration diagram of a power supply apparatus of first and second embodiments;

FIG. 3 is a configuration diagram of a power supply apparatus of third and fourth embodiments;

DETAILED DESCRIPTION

In an assumable example, an apparatus detects poor connection of a ground line in a power supply circuit. For example, the apparatus detects poor connection of a first ground line of a first power supply in a steering system of a vehicle. The apparatus includes a resistor to measure the current.

The apparatus merely determines whether the ground line is connected or disconnected. For example, in an apparatus equipped with multiple systems of power supply circuits that supply power to a load, there is no mention of what to do when the ground line of at least one system is abnormal. In addition, the apparatus does not take into account variations in wiring resistance between systems and deviations in current detection timing.

An object of the present disclosure is to provide a power supply apparatus capable of executing an abnormality processing when an abnormality occurs in the ground line of at least one system.

A power supply apparatus of the present disclosure includes a plurality of systems of power supply circuits and a plurality of ground current detectors. A plurality of power supply circuits are provided between one or more power sources and a load, and is capable of working together to supply power to the loads using the power of the power sources. A ground line connected to a negative electrode of the power source from the power supply circuits of the plurality of systems is configured independently for each system.

A plurality of ground current detectors detect a ground current, which is a current flowing through the ground line of each system. The control unit controls the operation of the power supply circuit of each system.

The control unit has a ground line diagnosis portion that diagnoses an abnormality in the ground line based on the ground current. When the ground line diagnosis portion determines that at least one system ground line is abnormal, the control unit changes an operation of the power supply circuit of the system determined to be abnormal.

For example, when the ground line of at least one system is determined to be abnormal, the control unit stops the operation of the power supply circuit of the system determined to be abnormal or limits the current.

The power supply apparatus of the present disclosure performs the abnormality processing when at least one system ground line is abnormal. Therefore, for example, when other systems are normal, power supply to the load can be appropriately continued.

A plurality of embodiments of a power supply apparatus will be described based on the drawings. The first to fourth embodiments shown in FIGS. 2 to 4B are collectively referred to as "present embodiment". The power supply apparatus of the present embodiment is applied as a drive apparatus for a steering assist motor in an electric power steering system for a vehicle.

[Electric Power Steering System]

Figure 1:
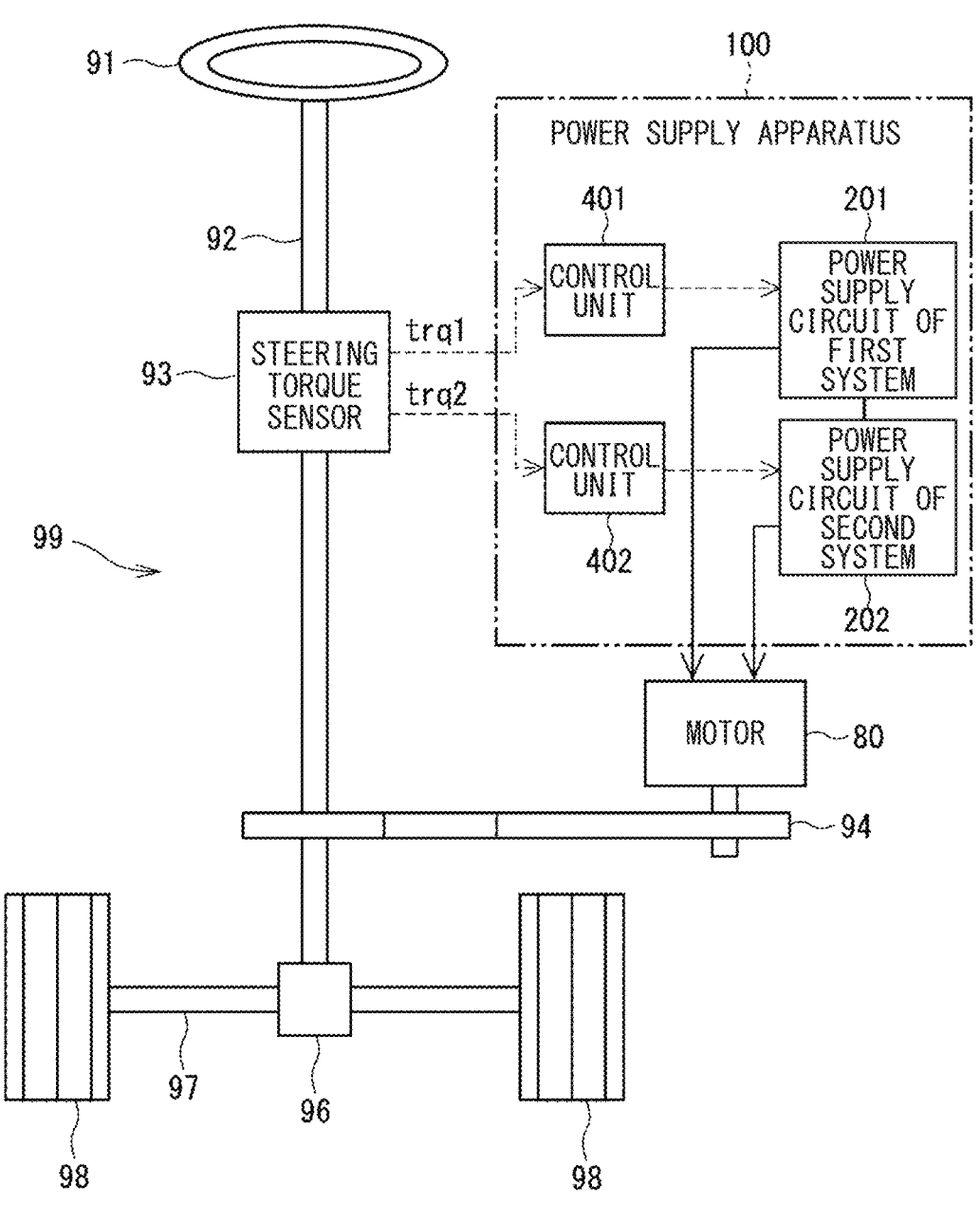
FIG. 1 is a configuration diagram of an electric power steering system in which a power supply apparatus of one embodiment is applied as a drive device for a steering assist motor.

A schematic configuration of the electric power steering system 99 will be described with reference to FIG. 1. Although a column-assist type electric power steering system is illustrated in FIG. 1, the power supply apparatus 100 of the present embodiment can also be applied to a rack-assist type electric power steering system.

A steering shaft 92 is connected to a steering wheel 91. A pinion gear 96 provided at an end of the steering shaft 92 engages with a rack shaft 97. A pair of wheels 98 are provided at both ends of the rack shaft 97 via, for example, tie rods. When the driver rotates the steering wheel 91, the steering shaft 92 connected to the steering wheel 91 rotates. A rotational motion of the steering shaft 92 is converted into a linear motion of the rack shaft 97 by the pinion gear 96 and the pair of road wheels 98 is steered to an angle corresponding to a displacement amount of the rack shaft 97.

A steering torque sensor 93 is provided at an intermediate portion of the steering shaft 92 to detect a steering torque applied by the driver. In the configuration example shown in FIG. 1, the detected values of the steering torques trq1 and trq2 of the two systems are redundantly output, but the detected value of one steering torque may be shared by the two systems.

A motor 80 functioning as a steering assist motor corresponds to a "load" of the power supply apparatus 100. The motor 80 of the present embodiment is a double winding three-phase brushless motor having two sets of windings. The power supply apparatus 100 includes two systems of power supply circuits 201 and 202 that supply power to two sets of windings, and control units 401 and 402 that control operations of the power supply circuits 201 and 202. Hereinafter, numeral "1" is attached to an end of the symbol of the components and the symbol of the physical quantities related to the first system, and numeral "2" is attached to an end of the symbol of the components and the symbol of the physical quantities related to the second system.

The power supply apparatus 100 controls driving of the motor 80 so that the motor 80 generates desired assist torque based on steering torques trq1 and trq2. The assist torque generated by the motor 80 is transmitted to the steering shaft 92 via a reduction gear 94.

[Power Supply Apparatus]

Figure 2:
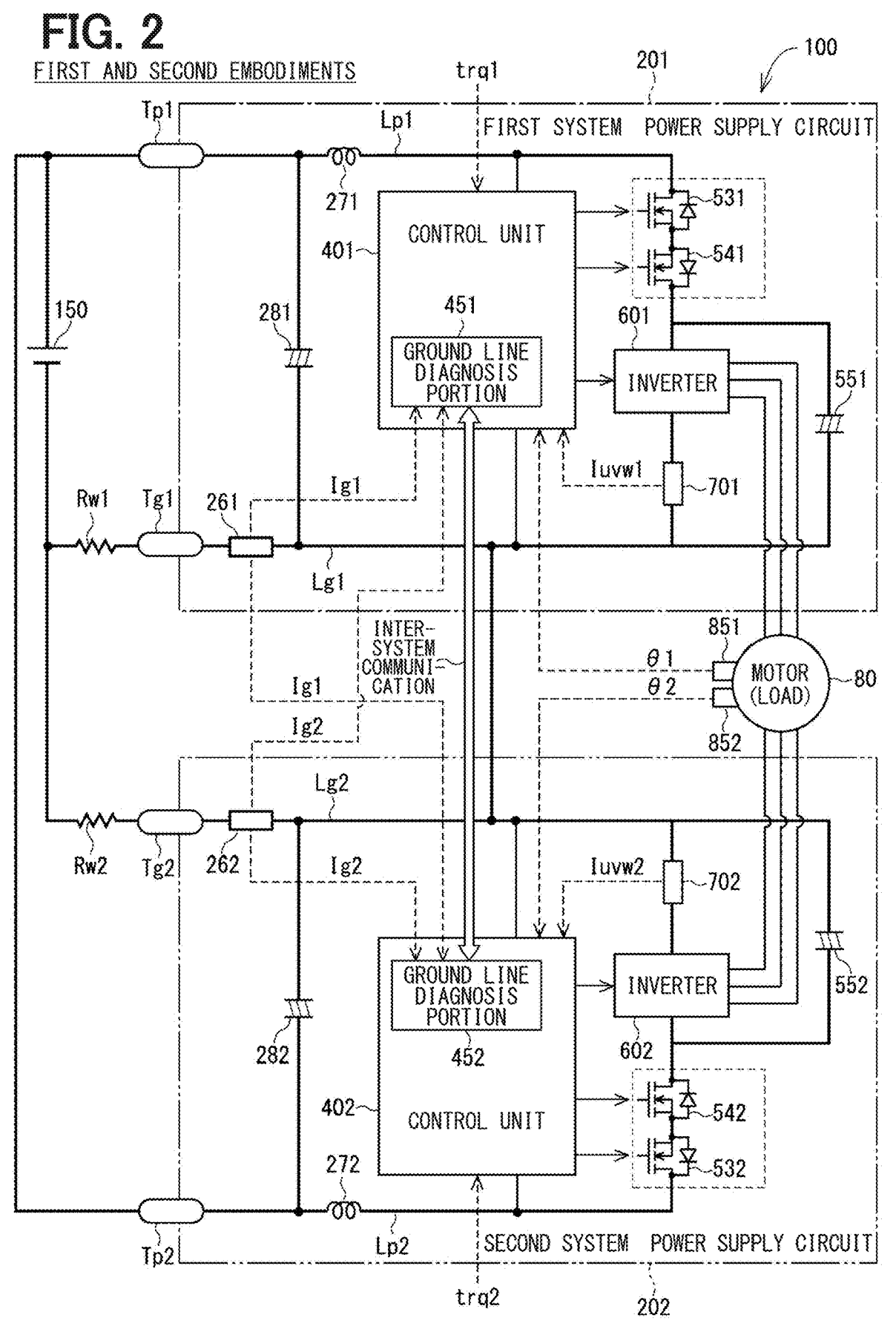
Figure 3:
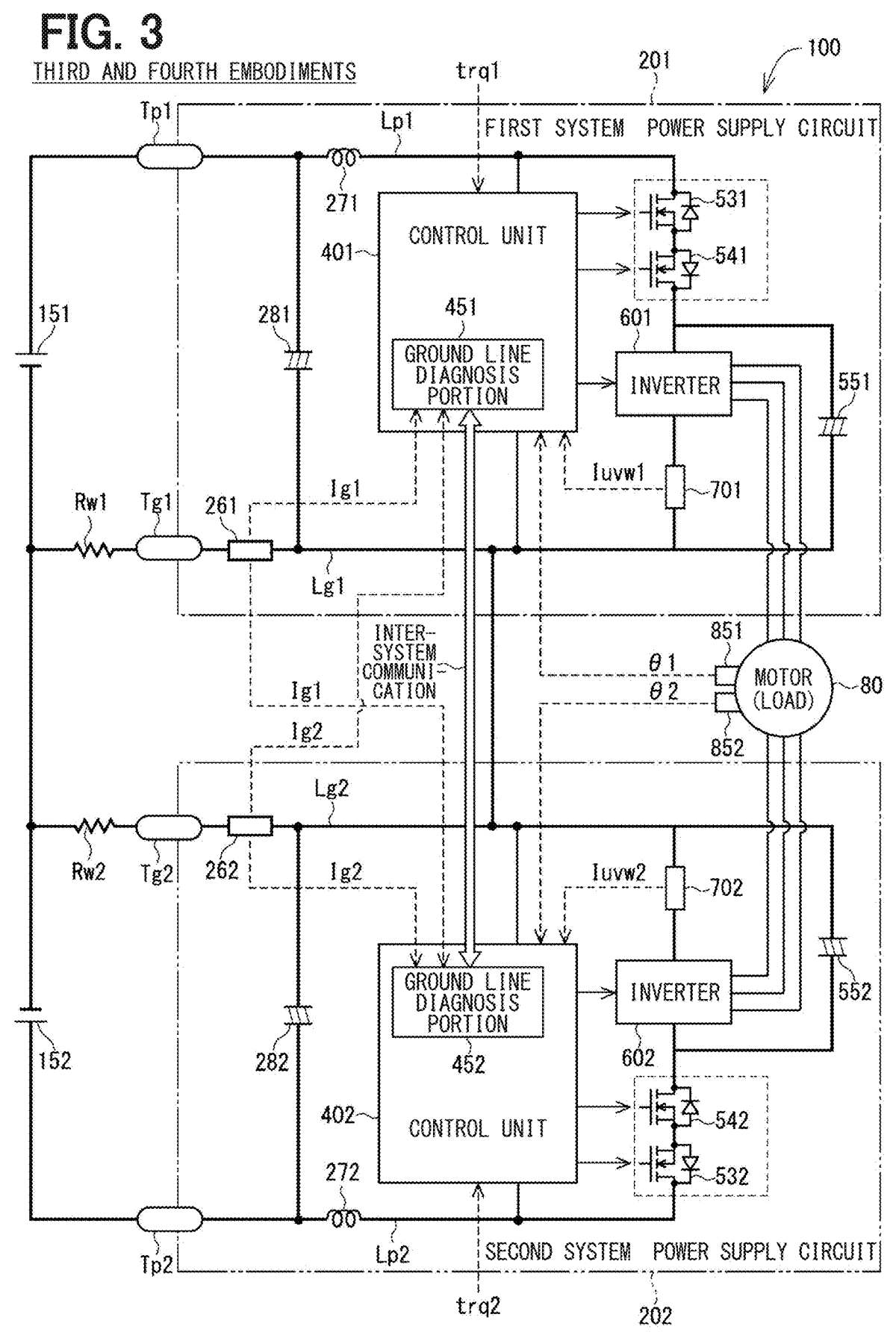
Figure 4A:
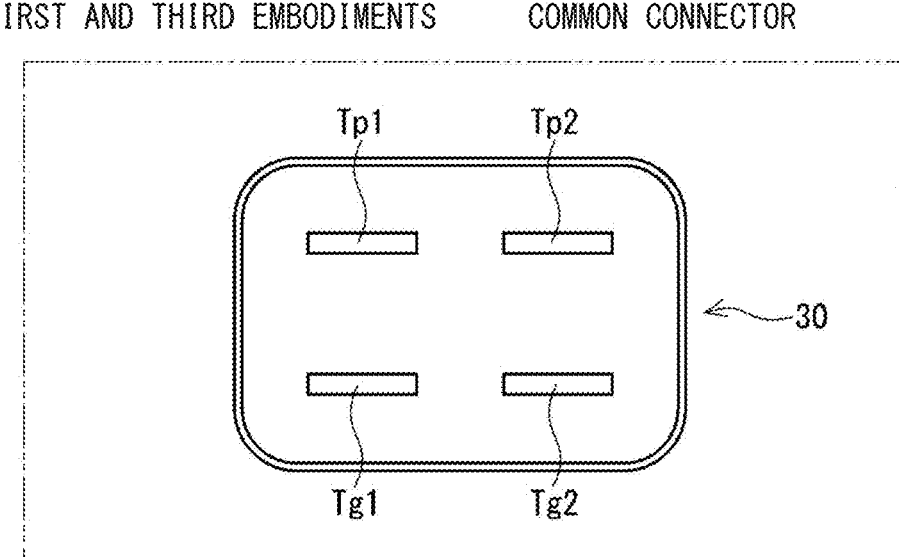
FIG. 4A is a configuration diagram of a connector provided with a ground terminal in the power supply apparatus of the first and third embodiments.
Figure 4B:
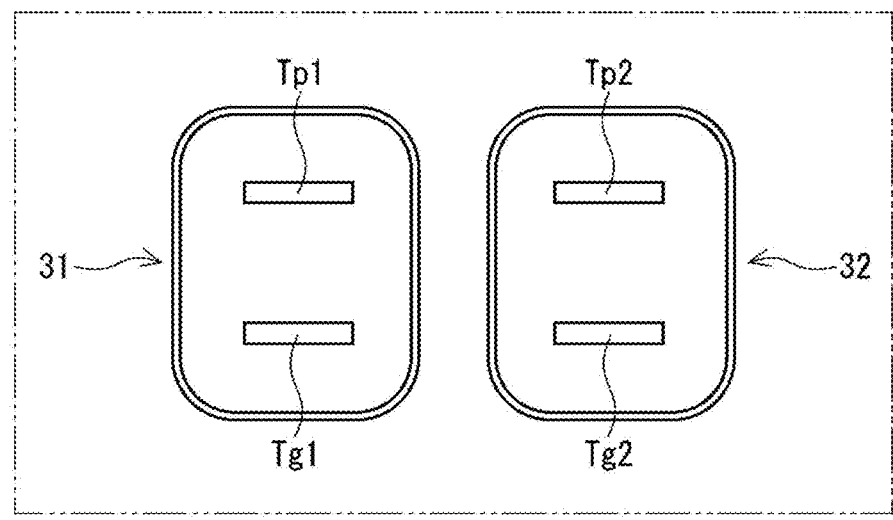
FIG. 4B is a configuration diagram of a connector provided with a ground terminal in the power supply apparatus of the second and fourth embodiments.

The configurations of the first to fourth embodiments will be described with reference to FIGS. 2 to 4B. In each embodiment, substantially the same components are denoted by the same reference numerals and description thereof is omitted. The first to fourth embodiments are formed by combining two types of power source configurations and two types of connector configurations. The power source configurations shown in FIG. 2 are referred to as first and second embodiments, and the power source configurations illustrated in FIG. 3 are referred to as third and fourth embodiments. In each power source configuration, configurations combined with the connector configuration of FIG. 4A are referred to as first and third embodiments, and configurations combined with the connector configuration of FIG. 4B are referred to as second and fourth embodiments.

First and Second Embodiments

First and second embodiments will be described with reference to FIG. 2. The power supply apparatus 100 is composed of two systems each including power supply circuits 201 and 202, ground current detectors 261 and 262, control units 401 and 402, and the like. In FIG. 2, a portion other than the power source 150, the motor 80 and the rotation angle sensors 851 and 852 corresponds to the power supply apparatus 100. The power supply apparatus 100, the motor 80, and the rotation angle sensors 851 and 852 may be configured as an integrated "electromechanical integrated motor".

A portion of the range indicated by the dashed-dotted line frame, excluding the control unit 401 and the ground current detector 261, is the power supply circuit 201 of the first system. A portion of the range indicated by the two-dot chain line frame, excluding the control unit 402 and the ground current detector 262, is the power supply circuit 202 of the second system. In the first and second embodiments, the power supply circuits 201 and 202 of each system are connected to a common power source 150. The power source 150 is a battery mounted on the vehicle.

The power supply circuits 201 and 202 are provided between the power source 150 and the motor 80 as a "load" and can work together to power the motor 80 using power from the power source 150. The power supply circuits 201 and 202 convert DC power from the power source 150 into three-phase AC power by the inverters 601 and 602 and supply the three-phase AC power to each winding set of the motor 80.

Power supply lines Lp1 and Lp2 connected from the power supply circuits 201 and 202 to the positive pole of the power source 150 and ground lines Lg1 and Lg2 connected to the negative pole of the power source 150 are configured independently for each system. It is normal for two power supply lines Lp1 and Lp2 of two systems to be configured independently for each system, but a configuration in which the ground side of each system is grounded to a common ground is also possible. In the present embodiment, the point is that there are independent ground lines Lg1 and Lg2 for each system.

The power supply lines Lp1 and Lp2 of each system are connected to the positive electrode of the power source 150 via the power terminals Tp1 and Tp2. The ground lines Lg1 and Lg2 of each system are connected to the negative pole of the power source 150 via the ground terminals Tg1 and Tg2. In the present embodiment, attention is paid to the ground lines Lg1 and Lg2, and the power lines Lp1 and Lp2 are not mentioned further.

The ground lines Lg1 and Lg2 include a cable portion from the power source 150 to the ground terminals Tg1 and Tg2, a connecting portion between the cable and the ground terminals Tg1 and Tg2, and a wiring portion in the circuit formed by, for example, a substrate pattern. The total of the above-mentioned portions is defined as wiring resistances Rw1 and Rw2 of the ground lines Lg1 and Lg2, and a resistance symbol is shown as an image in the cable portion that occupies most of the wiring length.

Since the power supply circuits 201 and 202 of the two systems have substantially the same configuration, the power supply circuit 201 of the first system will be described as a representative. Regarding the power supply circuit 202 of the second system, the symbols of the components and the symbols of the physical quantities in the description of the power supply circuit 201 of the first system are interpreted by replacing the endings of "1" with "2".

The power supply circuit 201 mainly includes an inverter 601, a coil 271 and a capacitor 281 that constitute a noise filter, a power relay 531, and a phase current detector 701 having a reverse connection protection relay 541, a smoothing capacitor 551, a shunt resistor, etc. The inverter 601 has three-phase upper and lower arm switching elements that are bridge-connected. Since this configuration is a well-known technology in the motor driving device of the electric power steering system, detailed description thereof will be omitted. A motor relay may be provided between the inverter 601 and the motor 80.

The ground current detector 261 detects the ground current Ig1, which is the current flowing through the ground line Lg1 of the first system. The ground current detector 261 detects current by converting the voltage across the current detection resistor into current. In FIG. 2, like the phase current detector 701 of the inverter 601, the ground current detector 261 is shown as a schematic block.

The control unit 401 controls the operation of the power supply circuit 201 of the first system. The control unit 401 is composed of a microcomputer or a custom IC. The control unit 401 includes a CPU (not shown), a ROM, a RAM, an I/O, a bus line connecting these configurations, and a like, and executes a control by the software process with performing, by the CPU, the program stored in advance in a tangible memory device such as a ROM (that is, a readable non-transitory tangible storage medium); or by the hardware processing with the dedicated electronic circuit.

A signal input to the control unit 401 is indicated by a dashed arrow, and a signal output by the control unit 401 is indicated by a solid arrow. When the system is activated, for example, when the normality of circuit elements, sensors, etc. is confirmed by an initial check, the control unit 401 turns on the power relay 531 and the reverse connection protection relay 541. When the motor 80 is driven, the control unit 401 acquires a phase current Iuvw1 detected by the phase current detector 701 and a rotation angle θ1 detected by the rotation angle sensor 851. The control unit 401 calculates a voltage command through current feedback control based on the phase current Iuvw1 and the rotation angle θ1 and outputs a drive signal to the inverter 601 so that the motor 80 outputs an assist torque corresponding to steering torque trq1.

In particular, the control unit 401 of the present embodiment has a ground line diagnosis portion 451 that diagnoses an abnormality in the ground line based on the ground current. Here, in the control units 401 and 402 of two systems, the system including the control unit is referred to as "own system", and the system including other control units is referred to as "other system". The ground line diagnosis portion 451 of the first system acquires both the ground current Ig1 of the own system (that is, the first system) and the ground current Ig2 of the other system (that is, the second system).

The ground line diagnosis portion 451 of the first system diagnoses an abnormality of at least the ground line Lg1 of the own system based on the ground currents Ig1 and Ig2 of the two systems. Abnormalities of the ground lines Lg1 and Lg2 include disconnection of the cable and poor contact of the ground terminals Tg1 and Tg2. Details of the abnormality diagnosis will be described later with reference to FIGS. 5, 6A, and 6B.

The ground line diagnosis portions 451 and 452 are provided for each system. The ground line diagnosis portion 451 of the first system and the ground line diagnosis portion 452 of the second system mutually communicate information regarding abnormality diagnosis of the ground lines Lg1 and Lg2 by inter-system communication. For example, when the control units 401 and 402 are composed of microcomputers, so-called inter-microcomputer communication corresponds to inter-system communication.

When the ground line diagnosis portions 451 and 452 determine that at least one system ground line is abnormal, the control units 401 and 402 change the operation of the power supply circuit of the system determined to be abnormal. That is, the control units 401 and 402 carry out "abnormality processing". The details of the abnormality processing will be described later with reference to FIG. 5.

In the first and second embodiments, the power supply circuits 201 and 202 of each system are connected to the common power source 150, so that the power supply voltage applied to the ground lines Lg1 and Lg2 of the two systems does not vary. In addition, the cable lengths from the power source 150 to the power supply apparatus 100 are substantially the same, and variations in the wiring resistances Rw1 and Rw2 are suppressed.

Third and Fourth Embodiments

The third and fourth embodiments will be described with reference to FIG. 3. In the third and fourth embodiments, the power supply circuits 201 and 202 of each system are connected to corresponding power sources 151 and 152 for each system. The negative poles of the power sources 151 and 152 are connected to the chassis of the vehicle, which is a common ground, and are at the same potential.

Preferably, the two power sources 151 and 152 are redundantly provided with equivalent capacity and output. In addition, it is preferable that the cable lengths from the power sources 151 and 152 to the power supply apparatus 100 are approximately the same, and the wiring resistances Rw1 and Rw2 are approximately the same. However, even if the wiring resistances Rw1 and Rw2 are different for each system, in the present embodiment, by converting the current into power as will be described later, it is possible to perform abnormality diagnosis in consideration of variations in wiring resistance.

Since the power sources 151 and 152 are redundantly provided in the third and fourth embodiments, even if one power source fails, the other power source can continue the operation of the power supply apparatus 100. Therefore, system reliability is improved.

[Connector]

Next, with reference to FIGS. 4A and 4B, a configuration example of a connector provided with the power terminals Tp1 and Tp2 and the ground terminals Tg1 and Tg2 of the power supply circuits 201 and 202 will be described. The power supply apparatus 100 of the present embodiment is detachably connected via a connector to a power cable connected to a common power source 150 or system-specific power sources 151 and 152 mounted on the vehicle.

As shown in FIGS. 2 and 3, the ground lines Lg1 and Lg2 of each system can be connected to a common power source 150 or system-specific power sources 151 and 152 via the ground terminals Tg1 and Tg2. The power lines Lp1 and Lp2 of each system can be similarly connected to the power source via the power terminals Tp1 and Tp2, but reference to the power supply terminals Tp1 and Tp2 is omitted here.

In the configuration example shown in FIG. 4A, the ground terminals Tg1 and Tg2 of two systems are provided at an opening of the common connector 30. The combination of the common power source 150 and the common connector 30 shown in FIG. 2 is the first embodiment, and the combination of the system-specific power sources 151 and 152 and the common connector 30 shown in FIG. 3 is the third embodiment. In the first and third embodiments, the attachment and detachment of the common connector 30 can be performed at once, so that the attachment workability is improved.

In the configuration example shown in FIG. 4B, the ground terminals Tg1 and Tg2 of each system are provided at the openings of the connectors 31 and 32 corresponding to each system. The combination of the common power source 150 and the system-specific connectors 31 and 32 shown in FIG. 2 is the second embodiment, and the combination of the system-specific power sources 151 and 152 and the system-specific connectors 31 and 32 shown in FIG. 3 is the fourth embodiment. In the second and fourth embodiments, the connectors 31 and 32 are made small and can be shared with the connectors of other device in a single-system specification.

[Ground Wire Abnormality Diagnosis]

Figure 5:
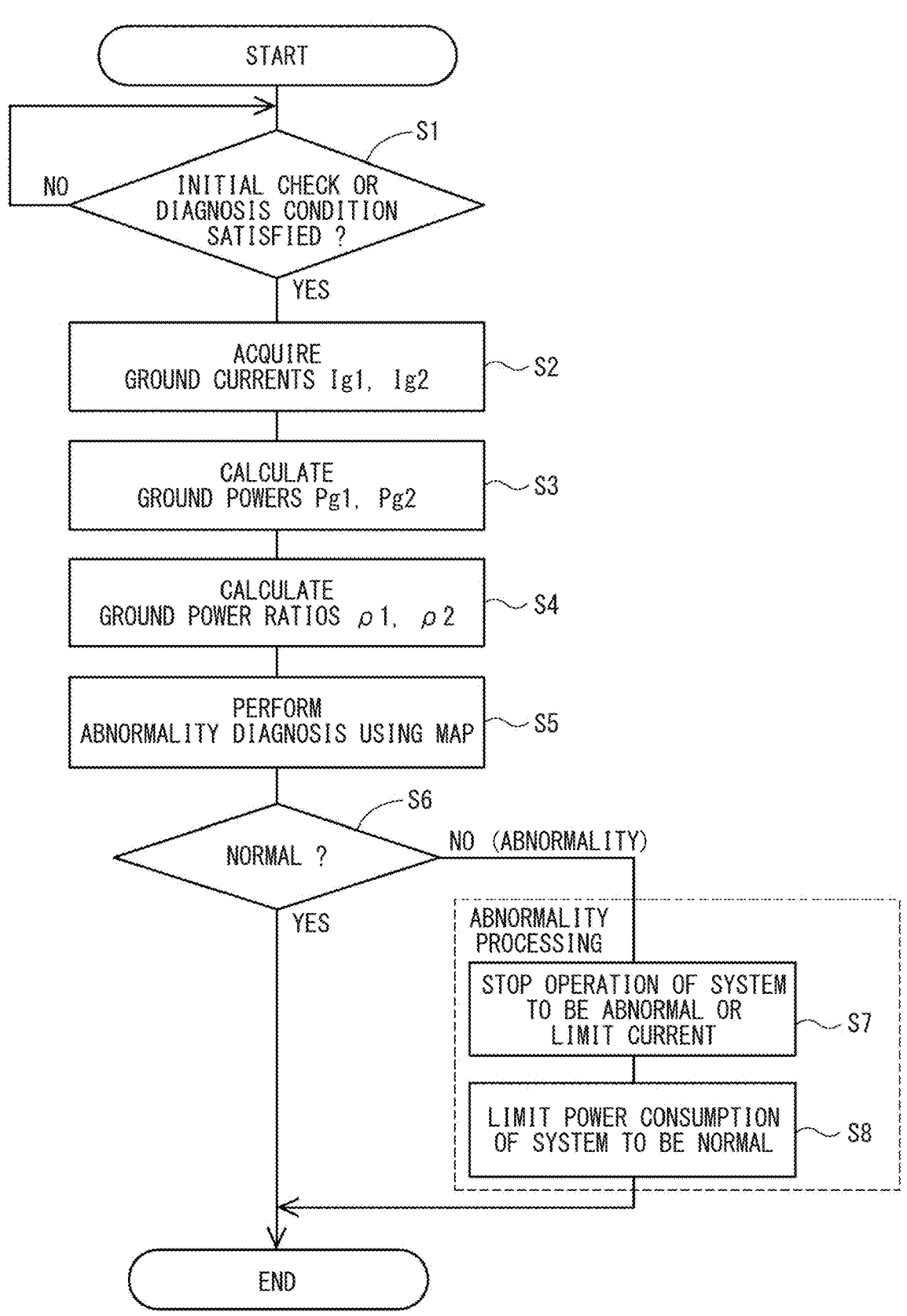
FIG. 5 is a flowchart of an abnormality diagnosis for a ground line.
Figure 6A:
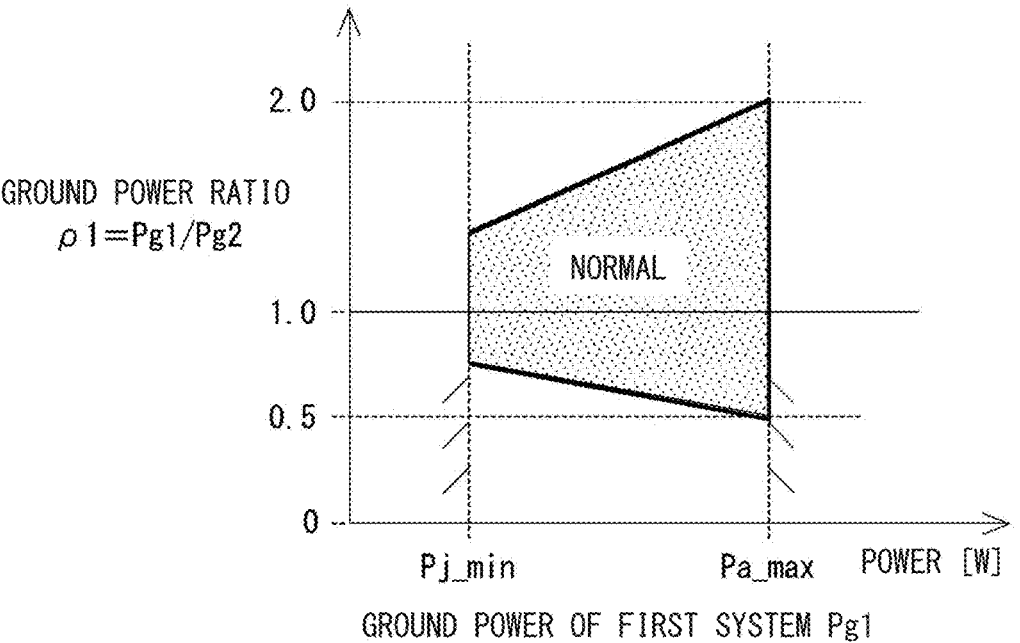
FIG. 6A is an abnormality diagnosis map of a first system.
Figure 6B:
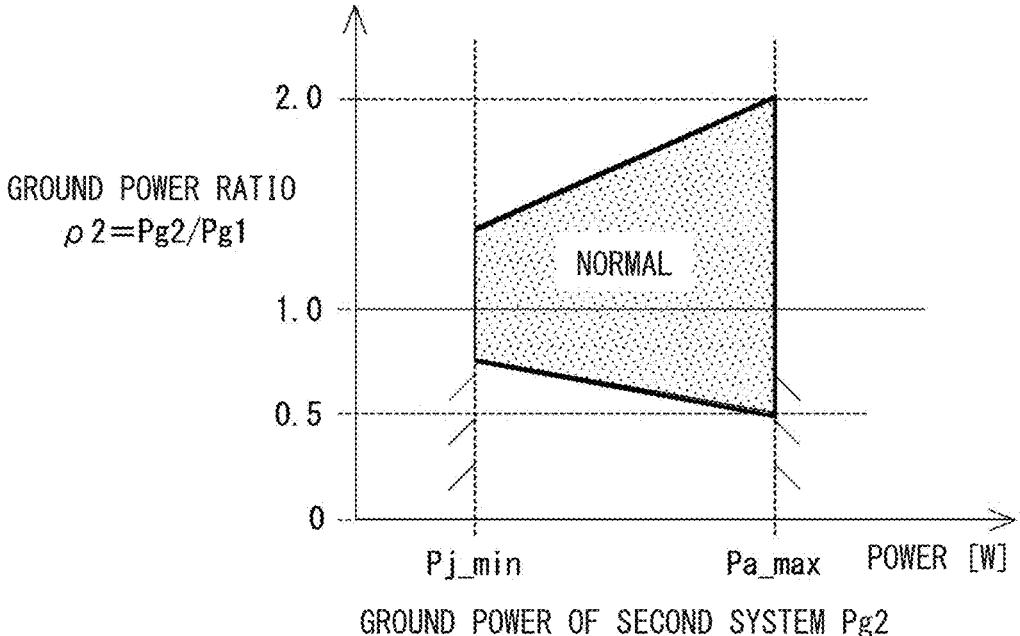
FIG. 6B is an abnormality diagnosis map of a second system.

The ground line abnormality diagnosis according to the present embodiment will be described with reference to the flowchart of FIG. 5 and the abnormality diagnosis maps of FIGS. 6A and 6B. The symbol "S" in the flow chart indicates step. This abnormality diagnosis is performed, for example, during an initial check after system activation. Alternatively, the abnormality diagnosis may be performed at all times during system operation, at regular intervals, or when another check determines that there is a suspicion of an abnormality.

In S1, it is determined whether it is an initial check or whether the diagnosis conditions are satisfied. As an example of diagnosis conditions, it is necessary that the minimum power Pj_min that can be determined correctly in the abnormality diagnosis map can be consumed by the ground lines Lg1 and Lg2 of each system. When the outputs instructed to the inverters 601 and 602 do not reach the minimum level, it is assumed that the diagnosis conditions are not satisfied, and NO is determined in S1. If YES in S1, the process proceeds to S2.

In S2, the ground line diagnosis portions 451 and 452 acquire the ground currents Ig1 and Ig2 of the first system and the second system. In other words, the ground line diagnosis portion of each system acquires current information of the own system and the other systems. In S3, the ground line diagnosis portions 451 and 452 calculate ground powers Pg1 and Pg2 based on the ground currents Ig1 and Ig2 and the wiring resistances Rw1 and Rw2. The ground powers Pg1 and Pg2 are powers consumed by energization of the ground lines Lg1 and Lg2, and are calculated by equations (1.1) and (1.2). For the wiring resistances Rw1 and Rw2, initial values at the time of manufacturing may be used as fixed values, or learned values may be used as described later.

$$Pg1=Rw1{\times}Ig1^2 \qquad (1.1)$$

$$Pg2=Rw2{\times}Ig2^2 \qquad (1.2)$$

In S4, the ratio of the ground powers Pg1 and Pg2 between the first system and the second system is calculated. Specifically, the ground line diagnosis portions 451 and 452 of each system divide the ground power of the own system by the ground power of the other system to calculate the ratios ρ1 and ρ2 of the ground power. The ground line diagnosis portion 451 of the first system calculates the ground power ratio ρ1 on the vertical axis in FIG. 6A by using the equation (2.1). The ground line diagnosis portion 452 of the second system calculates the ground power ratio ρ2 on the vertical axis of FIG. 6B by using the equation (2.2).

$$\rho1=Pg1/Pg2 \qquad (2.1)$$

$$\rho2=Pg2/Pg1 \qquad (2.2)$$

In S5, the ground line diagnosis portions 451 and 452 perform abnormality diagnosis using the abnormality diagnosis map. FIG. 6A shows the abnormality diagnosis map of the first system, and FIG. 6B shows the abnormality diagnosis map of the second system. In the abnormality diagnosis map, a normal range is defined by boundary lines representing threshold values. When the value is out of the normal range, the ground line diagnosis portions 451 and 452 determine that the ground lines Lg1 and Lg2 are abnormal. FIG. 6A will be described below as a representative. The same applies to FIG. 6B.

A horizontal axis of the abnormality diagnosis map of the first system indicates a ground power Pg1, and a vertical axis indicates a ground power ratio ρ1. The power threshold on the minimum side of the horizontal axis indicates a determinable minimum power Pj_min. The power threshold on the maximum side of the horizontal axis indicates an allowable power maximum value Pa_max. The allowable power maximum value Pa_max is set based on, for example, the ratings of the switching elements forming the power supply circuit 201. The ground line diagnosis portion 451 determines that there is an abnormality when the ground power Pg1 exceeds the maximum value Pa_max, which is the "predetermined allowable power".

Next, regarding the ground power ratio ρ1 on the vertical axis, the ground power ratio ρ1 becomes ideally 1 if the ground lines Lg1 and Lg2 of the two systems are normal and there is no variation in the operating characteristics of the circuit. On the other hand, the abnormality threshold is set such that the ground power ratio ρ1 at the maximum allowable power value Pa_max is allowed, for example, from 1/2 to 2 times.

The abnormality threshold is close to 1 when the ground power Pg1 is small, and is farther from 1 as the ground power Pg1 increases. That is, the normal range is set to widen as the ground power Pg1 increases. The map abnormality threshold may be set not only by a straight line but also by a curved line. Further, in the third and fourth embodiments in which the power supply circuits 201 and 202 of each system are respectively connected to the power sources 151 and 152 of each system, the abnormality threshold may be set according to the power supply voltage of the corresponding power source.

Returning to the flowchart, in S5, the ground line diagnosis portions 451 and 452 diagnose the abnormality of the ground lines Lg1 and Lg2 based on the ground power ratios ρ1 and ρ2 of the two systems as described above. At this time, the ground line diagnosis portions 451 and 452 may learn the wiring resistances Rw1 and Rw2 of the ground lines Lg1 and Lg2 based on the calculation data while diagnosing the ground lines Lg1 and Lg2 for abnormality. As a result, it is possible to improve the accuracy of abnormality diagnosis in response to changes over time in the wiring resistances Rw1 and Rw2 after manufacturing.

In addition, the ground line diagnosis portions 451 and 452 communicate the diagnosis results between systems and compare them, thereby making the detection function redundant. Therefore, even if there is a deviation in the current detection timing, correct abnormality determination can be made by appropriately correcting the deviation.

In S6, it is determined whether the result of the abnormality diagnosis is normal. If YES in S6, the routine ends. If NO in S6, that is, when there is an abnormality, the control units 401 and 402 carry out an abnormality processing. For example, it is assumed that the ground line Lg1 of the first system is determined to be abnormal and the second system is normal.

In S7, the control unit 401 of the first system changes the operation of the power supply circuit 201 of the first system determined to be abnormal. Specifically, the control unit 401 stops the operation of the power supply circuit 201 of the first system or limits the current. For example, in the case of an abnormality at a level at which current can be supplied, the current supplied to the inverter 601 may be limited, and the operation may be continued while limiting the output of the first system. When stopping the operation of the power supply circuit 201, in addition to turning off all the elements of the inverter 601, the power relay 531 and the reverse connection protection relay 541 may be turned off. Reverse input from the motor 80 side can be cut off by turning off the reverse connection protection relay 541.

When the operation of the power supply circuit 201 of the first system is stopped and an attempt is made to maintain the required output of the motor 80, it is required that the power supply circuit 202 of the second system bears the outputs of the two systems during normal operation. In order to prevent the output of the second system from becoming excessive as a result, in S8, the control unit 402 of the second system limits the power consumption of the normal system. For example, the control unit 402 limits the power consumption of the power supply circuit 202 of the second system to be equal to or less than the maximum allowable power value Pa_max, or to be equal to or less than half of the power consumption when the two systems are normal.

[Effects]

As described above, the power supply apparatus 100 of the present embodiment performs the abnormality processing when at least one system ground line is abnormal. Therefore, for example, when other systems are normal, power supply to the motor 80 can be appropriately continued.

The ground line diagnosis portions 451 and 452 calculate the ground powers Pg1 and Pg2 based on the ground currents Ig1 and Ig2 and the wiring resistances Rw1 and Rw2 of the ground lines Lg1 and Lg2, and diagnose the abnormality based on the ratios ρ1 and ρ2 of the ground powers Pg1 and Pg2 of the two systems. By using the ground powers Pg1 and Pg2 that reflect the information of the wiring resistances Rw1 and Rw2, it is possible to perform an appropriate abnormality diagnosis in consideration of variations in the wiring resistances Rw1 and Rw2.

The ground line diagnosis portions 451 and 452 determine that there is an abnormality when the ground powers Pg1 and Pg2 exceed a predetermined allowable power value Pa_max. As a result, problems such as overheating due to excessive power consumption in the ground lines Lg1 and Lg2 can be avoided.

Other Embodiments (a) In a power supply apparatus having three or more multiple systems of power supply circuits, an abnormality in the ground lines of the multiple systems may be diagnosed. In this case, the abnormality is diagnosed based on the ratio of the ground power of two systems selected from among the plurality of systems, and by combining the results, it is possible to determine the abnormality of the ground line of each system. Further, for example, in the case of three systems, a mixed power source configuration may be employed in which two of the three systems are connected to a common power source and the other system is connected to an individual power source. The same applies to the configuration of the relay server 5.

(b) The control unit including the ground line diagnosis portion is not limited to being provided independently for each system and communicating with each other, and may be configured by a circuit common with respect to multiple systems. In that case, the information of each system may be shared within one circuit.

(c) The power supply circuit is not limited to an inverter that supplies AC power converted from DC power of a power supply to a load such as an AC motor. For example, it may include an H-bridge circuit that supplies DC power converted from DC power of a power source to a load such as a DC motor. Alternatively, it may include a step-up/step-down converter that changes the output voltage with respect to the input voltage.

(d) The power supply is not limited to the battery, but may be a capacitor or a fuel cell. Also, instead of the power from the DC power supply, power obtained by rectifying the output of the AC power supply may be input to the power supply apparatus 100.

(e) A configuration in which the power supply terminals Tp1 and Tp2 and the ground terminals Tg1 and Tg2 of the power supply apparatus 100 are detachably connected to a power cable and a connector is not limited. A cable pulled out from the housing of the power supply apparatus 100 may be directly connected to an external dedicated power supply.

(f) As disclosed in JP-A-2020-18087 (corresponding US publication: US2020/0036269A1), a capacitor may be connected between the ground lines Lg1 and Lg2 of two systems. The disclosure of which is incorporated herein by reference.

(g) The power supply apparatus of the present disclosure is not limited to the electric power steering system, and can be applied to any system in which multiple power supply circuits cooperate to supply power to a load using power from a power source.

The present disclosure should not be limited to the embodiment described above. Various other embodiments may be implemented without departing from the scope of the present disclosure.

The control unit and the technique according to the present disclosure may be achieved by a dedicated computer provided by constituting a processor and a memory programmed to execute one or more functions embodied by a computer program. Alternatively, the control circuit described in the present disclosure and the method thereof may be realized by a dedicated computer configured as a processor with one or more dedicated hardware logic circuits. Alternatively, the control circuit and method described in the present disclosure may be realized by one or more dedicated computer, which is configured as a combination of a processor and a memory, which are programmed to perform one or more functions, and a processor which is configured with one or more hardware logic circuits. The computer programs may be stored, as instructions to be executed by a computer, in a tangible non-transitory computer-readable medium.

The present disclosure has been made in accordance with the embodiments. However, the present disclosure is not limited to such embodiments and configurations. The present disclosure also encompasses various modifications and variations within the scope of equivalents. Furthermore, various combination and formation, and other combination and formation including one, more than one or less than one element may be made in the present disclosure.

What is claimed is:

1. A power supply apparatus, comprising:
a plurality of systems of power supply circuits that are provided between one or more power sources and a load and that are capable of cooperatively supplying power to the load using power of the power sources, and in which ground lines connected to a negative pole of the one or more power sources are configured independently for each system;
a plurality of ground current detectors configured to detect a ground current that is a current flowing through the ground line of each system; and
a control unit configured to control an operation of the power supply circuit of each system,
wherein
the control unit has a ground line diagnosis portion configured to diagnose an abnormality in the ground line based on the ground current,
the ground line diagnosis portion calculates a ground power of each system, which is power consumed by energization of the ground line of each system, based on the ground current and a wiring resistance of the ground line of each system, and diagnoses an abnormality based on a ratio of the ground power of two systems selected from among a plurality of systems, wherein the ratio of the ground power comprises a ground power of one system divided by a ground power of another system, and
the ground line diagnosis portion diagnoses the abnormality in the ground line based on the ratio of the ground power, and
when the ground line diagnosis portion determines that the ground line of at least one system is abnormal, the control unit changes an operation of the power supply circuit of the system determined to be abnormal.

2. The power supply apparatus according to claim 1, wherein
the ground line diagnosis portion determines that there is an abnormality when the ground power exceeds a predetermined allowable power.

3. The power supply apparatus according to claim 1, wherein
the ground line diagnosis portion learns the wiring resistance of the ground line while diagnosing the ground line for abnormality.

4. The power supply apparatus according to claim 1, wherein
when the ground line of at least one system is determined to be abnormal, the control unit stops the operation of the power supply circuit of the system determined to be abnormal or limits the current.

5. The power supply apparatus according to claim 1, wherein
the ground line diagnosis portion is provided for each system, and
the ground line diagnosis portion of each system mutually communicates information regarding the abnormality diagnosis of the ground line through an inter-system communication.

6. The power supply apparatus according to claim 1, wherein
the power supply circuits are connected to a common power source.

7. The power supply apparatus according to claim 1, wherein
the power supply circuit of each system is connected to the power supply corresponding to each system.

8. The power supply apparatus according to claim 1, wherein
the ground line of each system is connectable to the power supply via each of ground terminals, and
the ground terminals of the plurality of systems are provided at an opening of a common connector.

9. The power supply apparatus according to claim 1, wherein
the ground line of each system is connectable to the power supply via each of ground terminals, and
the ground terminal of each system is provided at an opening of a connector corresponding to each system.

10. A power supply apparatus, comprising:
a plurality of systems of power supply circuits that are provided between one or more power sources and a load and that are capable of cooperatively supplying power to the load using power of the power sources, and in which ground lines connected to a negative pole of the power source are configured independently for each system;
a plurality of ground current detectors configured to detect a ground current that is a current flowing through the ground line of each system; and
a computer including a processor and a memory that stores instructions configured to, when executed by the processor, cause the processor to
control an operation of the power supply circuit of each system,
calculate a ground power of each system, which is power consumed by energization of the ground line of each system, based on the ground current and a wiring resistance of the ground line of each system,
diagnose an abnormality based on a ratio of the ground power of two systems selected from among a plurality of systems, wherein the ratio of the ground power comprises a ground power of one system divided by a ground power of another system, and the abnormality in the ground line is diagnosed based on the ratio of the ground power, and
change an operation of the power supply circuit of the system determined to be abnormal, when it is determined that the ground line of at least one system is abnormal.

11. The power supply apparatus according to claim 10, wherein
the computer causes the processor to
determine that there is an abnormality when the ground power exceeds a predetermined allowable power.

12. The power supply apparatus according to claim 10, wherein
the computer causes the processor to
learn the wiring resistance of the ground line while diagnosing the ground line for abnormality.

13. The power supply apparatus according to claim 10, wherein
the computer causes the processor to
stop the operation of the power supply circuit of the system determined to be abnormal or limits the current, when the ground line of at least one system is determined to be abnormal.

* * * * *